(12) United States Patent
Cobbley et al.

(10) Patent No.: US 8,148,803 B2
(45) Date of Patent: Apr. 3, 2012

(54) MOLDED STIFFENER FOR THIN SUBSTRATES

(75) Inventors: Chad A. Cobbley, Boise, ID (US); Cary J. Baerlocher, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 384 days.

(21) Appl. No.: 10/077,554

(22) Filed: Feb. 15, 2002

(65) Prior Publication Data

US 2003/0155636 A1    Aug. 21, 2003

(51) Int. Cl.
*H01L 23/495* (2006.01)

(52) U.S. Cl. ......... 257/676; 257/E31.118; 257/E21.499; 438/106

(58) Field of Classification Search .............. 257/778, 257/678, 777, 783, 668, 669, 667, 787, E23.001, 257/E23.18, 676, 675, E31.118, E21.499; 438/125, 112, 120, 106, 123; 428/901; 174/546; 361/748
See application file for complete search history.

(56) References Cited

U.S. PATENT DOCUMENTS

| | | | | |
|---|---|---|---|---|
| 4,710,419 A | * | 12/1987 | Gregory | 428/210 |
| 4,891,687 A | * | 1/1990 | Mallik et al. | 257/676 |
| 5,199,917 A | * | 4/1993 | MacDonald et al. | 445/24 |
| 5,650,593 A | * | 7/1997 | McMillan et al. | 174/542 |
| 5,888,849 A | * | 3/1999 | Johnson | 438/126 |
| 5,929,517 A | | 7/1999 | Distefano et al. | 257/707 |
| 5,973,389 A | * | 10/1999 | Culnane et al. | 257/678 |
| 6,020,221 A | * | 2/2000 | Lim et al. | 438/125 |
| 6,279,758 B1 | | 8/2001 | Wark et al. | 211/41.17 |
| 6,284,569 B1 | | 9/2001 | Sheppard et al. | 438/110 |
| 6,303,985 B1 | | 10/2001 | Larson et al. | 257/676 |
| 6,326,544 B1 | | 12/2001 | Lake | 174/52.2 |
| 6,426,565 B1 | * | 7/2002 | Bhatt et al. | 257/783 |
| 6,440,777 B2 | | 8/2002 | Cobbley et al. | 438/118 |
| 6,486,562 B1 | * | 11/2002 | Kato | 257/778 |
| 6,517,662 B2 | * | 2/2003 | Culnane et al. | 156/285 |
| 6,519,843 B2 | * | 2/2003 | Lauffer et al. | 29/840 |
| 6,541,847 B1 | * | 4/2003 | Hofstee et al. | 257/686 |
| 6,584,897 B2 | | 7/2003 | Cobbley et al. | 101/127 |
| 6,599,365 B1 | | 7/2003 | Jiang et al. | 118/504 |
| 6,602,740 B1 | * | 8/2003 | Mitchell | 438/127 |
| 6,724,071 B2 | | 4/2004 | Combs | 257/666 |
| 6,759,307 B1 | * | 7/2004 | Yang | 438/455 |
| 6,903,278 B2 | * | 6/2005 | Sathe | 174/255 |

* cited by examiner

*Primary Examiner* — Hoa B Trinh

(74) *Attorney, Agent, or Firm* — Whyte Hirschboeck Dudek SC

(57) ABSTRACT

A stiffener molded to a semiconductor substrate, such as a lead frame, and methods of molding the stiffener to the substrate are provided. The stiffener is molded to the substrate to provide rigidity and support to the substrate. The stiffener material can comprise a polymeric material molded to the substrate by a molding technique such as transfer molding, injection molding, and spray molding, or using an encapsulating material. One or more dies, chips, or other semiconductor or microelectronic devices can be disposed on the substrate to form a die assembly. The stiffener can be molded to a substrate comprising one or more dies, over which an encapsulating material can be applied to produce a semiconductor die package.

59 Claims, 6 Drawing Sheets

MOLDED STIFFENER FOR THIN SUBSTRATES

FIELD OF THE INVENTION

The present invention relates generally to a stiffener for substrates used in semiconductor fabrication processes, and more particularly to a stiffener molded onto thin substrates, such as lead frames, used during the production of die assemblies and packages.

BACKGROUND OF THE INVENTION

A stiffener device has been used with lead frames for die assembly and package production to provide support for flexible, and even flimsy, substrates. The stiffener can assist in preventing or reducing damage to the substrate and associated electrical components. Stiffeners are typically attached to lead frames by applying a strip of adhesive tape or a layer of adhesive paste to the stiffener and/or the surface of the lead frame.

Referring to FIG. 1, a prior art semiconductor die package 2 disposed within a package mold 4 is shown. Package 2 typically comprises a lead frame 6 (or other substrate), adhesive element 8, one or more dies 10, adhesive element 12, a metal or plastic stiffener 14, and an encapsulating material 16. Package mold 4 comprises mold plates 18. Mold plates 18, as illustrated in FIG. 1, define a mold gate 20 and a cavity 22 disposed within package mold 4.

The package illustrated in FIG. 1 can be assembled by first constructing a die assembly 24. Die assembly 24 comprises one or more dies 10 secured to lead frame 6 with adhesive element 8. After die assembly 24 is assembled, plastic or metal stiffener 14 is secured to lead frame 6 of die assembly 24 with adhesive element 12, and the die assembly is placed between mold plates 18 within cavity 22. Encapsulating material 16 is then introduced into package mold 4, through mold gate 20, and flows over die assembly 24. In such instances, encapsulating material 16 is generally heated prior to being injected into package mold 4, and flowed in and around die assembly 24, covering all or a portion of lead frame 6 and/or dies 10. Thereafter, encapsulating material 16 is allowed to harden. Mold plates 18 can then be removed whereby package 2, as illustrated in FIG. 2, remains.

In some situations, the stiffener comprises a metal or metal alloy. Unfortunately, metal stiffeners are difficult to cut with conventional, diamond-tipped saws. As such, metal stiffeners are burdensome to segment before and during package production. Likewise, the produced packages that incorporate metal stiffeners are also difficult to cut. As a result, it is laborious to separate packages from one another. Additionally, metal stiffeners are expensive and therefore contribute to added expense of the package.

Plastic stiffeners have also been used to support a lead frame. Typically, in those cases where a plastic stiffener is used, a thermoplastic or thermosetting polymeric material is heated and introduced into a mold and, upon cooling, the mold is opened and a plastic stiffener is produced. Thereafter, the plastic stiffener is secured to the lead frame using an adhesive tape or paste.

Plastic stiffeners offer several advantages over metal stiffeners. For one, plastic stiffeners can be more easily cut. This allows the plastic stiffeners to be segmented and packages separated from one another. Also, plastic stiffeners are less expensive than metal stiffeners. As such, the cost of semiconductor processing can be reduced. However, plastic stiffeners, like their metal counterparts, have associated disadvantages.

For example, a supply of adhesive must be procured in order to attach the stiffeners to lead frames. Purchasing, inventorying, and storing the adhesive can add to the cost of die assembly and package processing. Further, attaching a stiffener requires an attachment step be performed during processing, which can require additional processing apparatus, add to processing time, and provide an opportunity for error. Therefore, an improved stiffener and method of applying the same to a substrate is desirable.

SUMMARY OF THE INVENTION

In one aspect, the invention provides a semiconductor device comprising a substrate and a stiffener molded to the substrate.

The stiffener can be molded to the substrate by various techniques such as transfer molding, injection molding, or spray molding. The stiffener can also be molded to the substrate with an encapsulating material. Advantageously, the molded stiffener can provide stiffening to the substrate, or increase the rigidity to the substrate.

The molded stiffener can comprise a thermoplastic or a thermosetting polymeric material. In addition, the thermal coefficient of expansion of the molded stiffener and the substrate can correspond such that heating expands both the molded stiffener and the substrate approximately equally. The molded stiffener can be sized to correspond to a length and/or a width of the substrate, or the substrate can be sized to correspond to a length and/or a width of the molded stiffener.

Further, the molded stiffener can include at least one cross member and be in the form of a grid, a lattice, a grille, or a web. In one embodiment, the molded stiffener can protrude from the surface of the substrate and, as a result, form an enclosure for receiving an encapsulating material. In another embodiment, a first surface of the substrate can include a recess formed in the substrate such that the stiffener can be molded to the substrate within the recess. Therefore, the molded stiffener can be flush with the first surface of the substrate.

The substrate can have a first stiffener molded to a first surface of the substrate and a second stiffener molded to a second surface of the substrate. In such an embodiment, the first stiffener and the second stiffener can comprise different configurations and/or dimensions. For example, the first stiffener can protrude from the first surface of the substrate and the second stiffener can be disposed within a recess in the second surface of the substrate.

Another aspect of the invention provides a semiconductor assembly. The semiconductor assembly can comprise a die disposed on a first surface of a substrate as well as a stiffener molded to the first surface of the substrate. In one embodiment, the semiconductor assembly can have a second stiffener molded to a second surface of the substrate and a second die disposed on the second surface of the substrate.

A further aspect of the invention provides a semiconductor die package. The die package can comprise a substrate having a die disposed on the substrate, a stiffener molded to the substrate, and an encapsulating material covering the die. The encapsulating material can be at least partially bounded by the molded stiffener. In one embodiment, the die package can include a second stiffener molded to a second surface of the substrate. The die package can be formed by a technique such as transfer molding.

Another aspect of the invention provides a method of securing a stiffener to a substrate. The method can comprise the steps of providing a stiffener material and a substrate, molding the stiffener material to the substrate, and permitting the stiffener material to harden to form a molded stiffener secured to the substrate. The step of molding can comprise transfer molding, injection molding, spray molding, or molding by applying an encapsulating material to the substrate. The stiffener material can harden by heating the stiffener material, permitting the stiffener material to cool, curing the stiffener material with a catalyst, or curing the stiffener material with exposure to radiation.

Another aspect of the invention provides a method of molding a stiffener to a lead frame assembly. The method can comprise the steps of providing a lead frame assembly, which includes a substrate and two or more die disposed on the substrate, providing a stiffener material, molding the stiffener material to the substrate to form a molded stiffener, and singulating the lead frame assembly, with the molded stiffener thereon, to separate the two or more die.

In one embodiment, prior to the singulation step, the method can comprise the step of encapsulating the two or more die disposed on the lead frame assembly. The encapsulating material can be dispensed onto the die such that the molded stiffener provides a boundary for containing the encapsulating material therein.

Another aspect of the invention provides a method of forming a semiconductor die package. The method can comprise the steps of securing a die to a substrate, molding a stiffener material to the substrate to form a molded stiffener thereon, and encapsulating the die and the molded stiffener with an encapsulating material to form the semiconductor die package. In one embodiment, the step of encapsulating can comprise inserting the substrate, with the die and the molded stiffener disposed thereon, into an opening between two mold plates. After the encapsulating material has hardened, newly formed package can be removed from the mold plates.

In another embodiment, the method of forming the die package can comprise the steps of mounting a die on a lead frame, molding a stiffener to the lead frame, applying an encapsulating material to the die and the stiffener, and permitting the encapsulating material to harden to produce the die package.

BRIEF DESCRIPTION OF THE DRAWINGS

Embodiments of the invention are described below with reference to the accompanying drawings and are for illustrative purposes only. The invention is not limited in its application to the details of construction or the arrangement of the components set forth in the following description or illustrated in the drawings. The invention is capable of other embodiments or of being practiced or carried out in other various ways. Also, it is to be understood that the terminology and phraseology employed herein is for the purpose of description and illustration and should not be regarded as limiting. Like reference numerals are used to indicate like components.

DETAILED DESCRIPTION OF THE PREFERRED EMBODIMENT

The invention will be described generally with reference to the drawings for the purpose of illustrating the present preferred embodiments only and not for purposes of limiting the same.

While the term "lead frame" is used as a preferred substrate in the several embodiments and figures to describe the invention, other substrates known in the microelectronics or semiconductor industry are contemplated for use with the invention. A non-exhaustive list of such substrates that can be used in the context of the invention includes a flexible laminated polymer or polyimide layer, a non-flexible material such as a bismaleimide triazine (BT) resin, an FR4 laminate, an FR5 laminate, a CEM1 laminate, a CEM3 laminate, a ceramic metal frame, among others. Further, the substrate used in the invention comprises a "thin" substrate which, as used herein, is defined as a substrate having a thickness of less than about seventy-five microns (75 μm).

Figure 3:
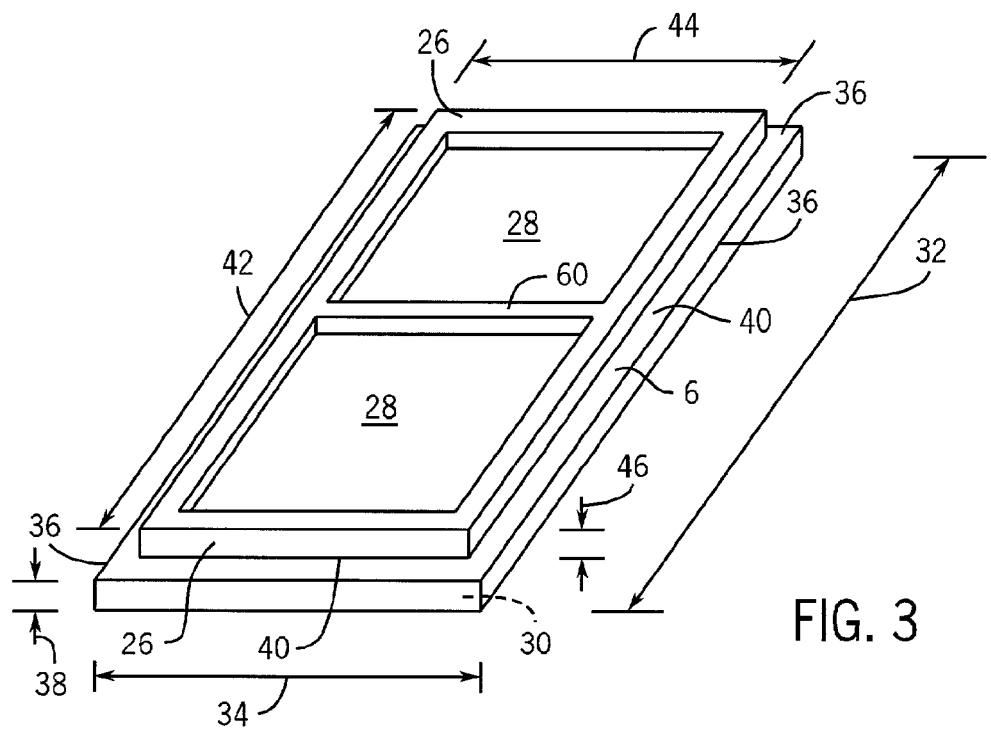
FIG. 3 is a perspective, top view of an embodiment of a molded stiffener according to the invention, disposed on a lead frame.

Turning to FIG. 3, an embodiment of a molded stiffener 26, according to the invention, associated with lead frame 6 is depicted. Lead frame 6 comprises a first surface 28, a second surface 30, a lead frame length 32, a lead frame width 34, leads frame edges 36, and a periphery 40 proximate the lead frame edges. Further, lead frame 6 comprises a "thin" substrate, and as such, has a thickness 38 of less than about seventy-five microns (75 μm). In one preferred embodiment, thickness 38 is less than about fifty microns (50 μm). In another preferred embodiment, thickness 38 is less than about thirty-five microns (35 μm).

Molded stiffener 26 comprises a stiffener length 42, a stiffener width 44, and a thickness 46. In preferred embodiments, thickness 46 of molded stiffener 26 is less than about one hundred microns (100 μm). In another preferred embodiment, thickness 46 is less than about seventy-five microns (75 μm). In yet another preferred embodiment, thickness 46 is less than about fifty microns (50 μm). Molded stiffener 26 can comprise a thermoplastic or thermosetting polymeric material such as epoxy.

Instead of molded stiffener 26 being secured to lead frame 6 using an adhesive element 12 (e.g., a strip of adhesive tape or a layer of adhesive paste) as used with prior art stiffeners, molded stiffener 26 can be molded directly to the lead frame. In one embodiment, molded stiffener 26 is molded to first surface 28 of lead frame 6 such that the molded stiffener extends or protrudes from the first surface as illustrated in FIG. 3. Likewise, in another embodiment, each of first surface 28 and second surface 30 can have molded stiffeners 26 disposed thereon. In yet another embodiment, molded stiffener 26 can be molded proximate edges 36 and/or periphery 40 of lead frame 6. The molding of molded stiffener 26 to lead frame 6 can be accomplished using a variety of known techniques.

Figure 1:
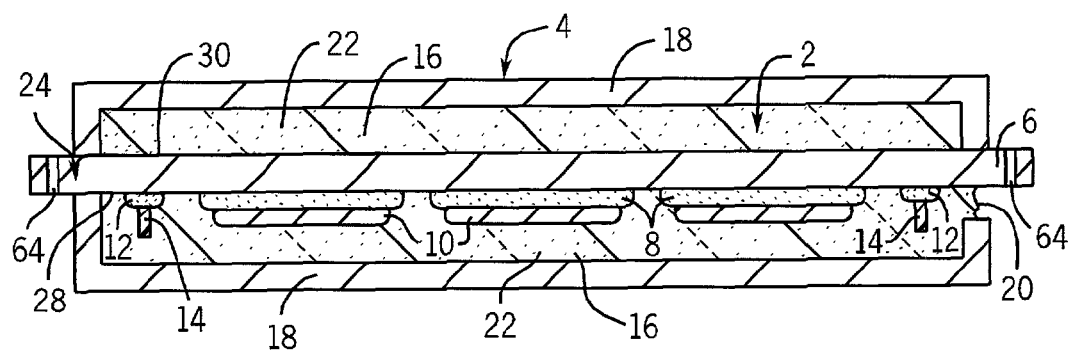
FIG. 1 is an elevational, end cross-sectional view of a package known in the art, disposed within mold plates and incorporating an attached plastic or metal stiffener.
Figure 2:
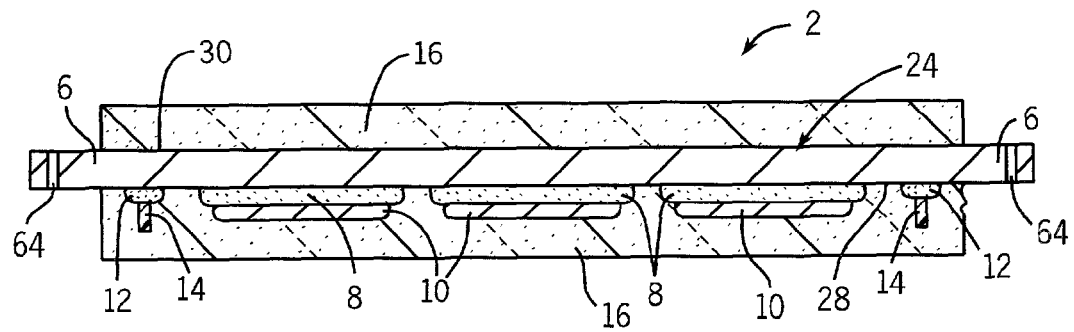
FIG. 2 is an elevational, end cross-sectional view of the prior art package of FIG. 1 with the mold plates removed.
Figure 4:
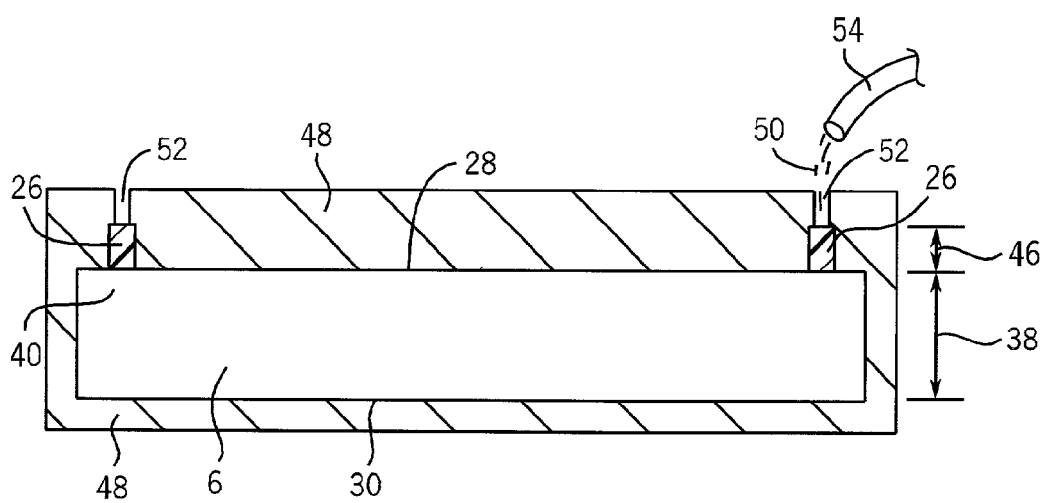
FIG. 4 is an elevational, end cross-sectional view illustrating an embodiment of a method according to the invention, wherein the molded stiffener of FIG. 3 is produced and secured to the lead frame using an injection molding technique.

In one embodiment of the invention, molded stiffener 26 is molded to lead frame 6 by injection molding as illustrated in FIG. 4. Fabrication of molded stiffener 26 by injection molding can be performed by placing a stiffener mold 48 corresponding to a desired design of molded stiffener 26 around lead frame 6 such that the lead frame is enveloped and enclosed by the stiffener mold. Thereafter, a heated, viscous stiffener material 50 (e.g., thermoplastic or thermosetting polymeric material) is injected into the stiffener mold 48 through mold gate 52 using an injection molding apparatus 54. Stiffener material 50 is subsequently allowed to harden, typically by heating, cooling, and/or curing. Hardening can also be accomplished by using an appropriate catalyst, such as an amine, and/or exposure to a radiation source, such as ultraviolet light (UV). The hardened stiffener material 50 is thus secured to (i.e., molded to), or within, lead frame 6. After hardening of molded stiffener 26, stiffener mold 48 can be removed such that lead frame 6, with molded stiffener 26 attached thereto, remains. Thus, molded stiffener 26 is secured to lead frame 6 without the need for a separate step involving the application of an adhesive element 12 (FIG. 1).

Figure 5:
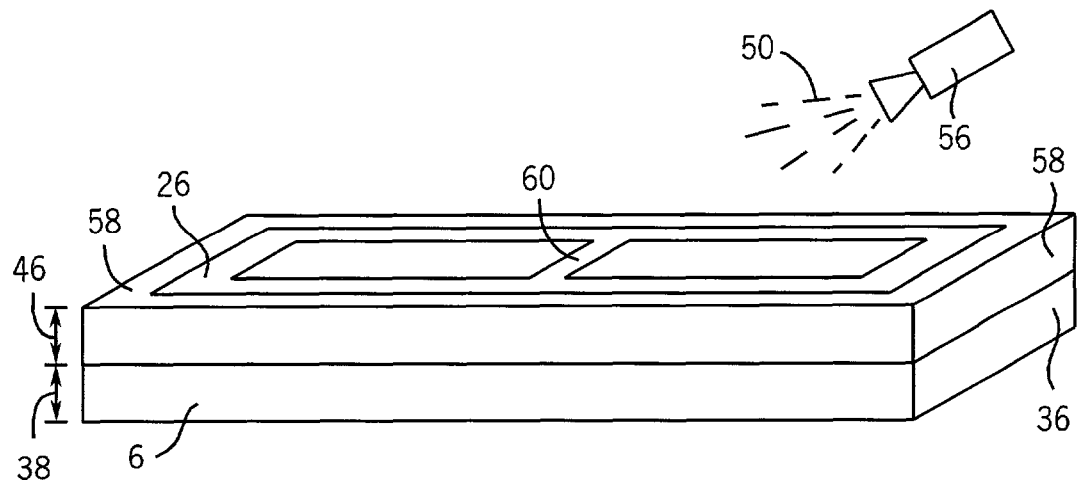
FIG. 5 is a perspective, top view illustrating another embodiment of a method according to the invention, wherein the molded stiffener of FIG. 3 is produced and secured to the lead frame by a spray molding technique that employs a template.

Besides injection molding, molded stiffener 26 can also be fabricated by spray molding stiffener material 50 onto lead frame 6, as illustrated in FIG. 5. By using a spray gun 56 or other like device capable of producing a spray, stream, mist, or the like, a viscous, flowable stiffener material 50, as described above, can be applied to the lead frame 6. To assist this process, a template 58 such as a mask, stencil, screen print, and the like, can be disposed upon lead frame 6. Stiffener material 50 can then be sprayed upon template 58 and exposed portions of lead frame 6. After stiffener material 50 has hardened, template 58 can be lifted away from lead frame 6 leaving behind molded stiffener 26 which has now been secured to lead frame 6.

Figure 6:
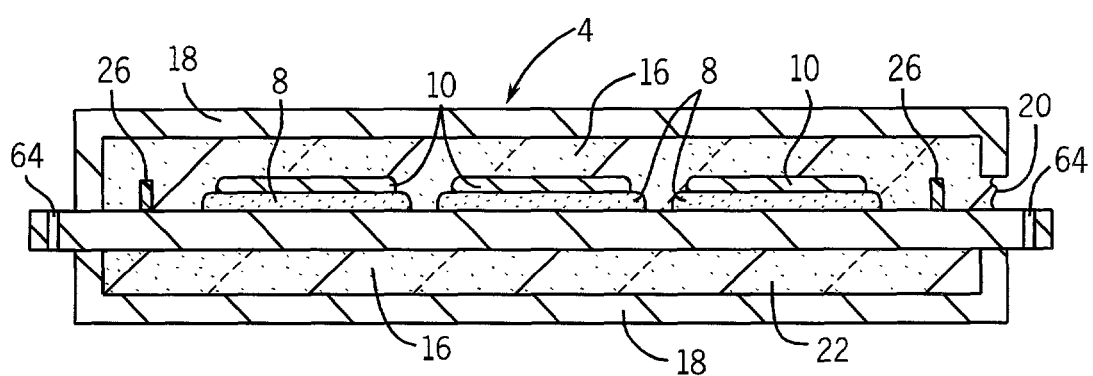
FIG. 6 is an elevational, end cross-sectional view illustrating another embodiment of a method according to the invention, wherein the molded stiffener of FIG. 3 is produced and secured to the lead frame by a transfer molding technique that employs an encapsulating material and mold plates.

In another embodiment of the method of the invention, as illustrated in FIG. 6, molded stiffener 26 can be molded onto lead frame 6 using a conventional encapsulating material 16 and mold plates 18 in a transfer molding process. In addition to protecting lead frames 6 and/or dies 10 from damage, encapsulating material 16 can be used to secure molded stiffener 26 to the lead frames. This method advantageously uses no adhesive 12 (FIG. 1) to secure molded stiffener 26 to lead frame 6.

Referring back to FIG. 3, as illustrated, molded stiffener 26 can also comprise cross member 60. Cross member 60 functions to provide additional support and rigidity to lead frame 6 in addition to the support provided by stiffeners known in the art lacking cross member 60. Despite molded stiffener 26 being depicted in FIG. 3 with one cross member 60, the molded stiffener can include several cross members and resemble a variety of shapes such as a grid, a lattice, a grille, a web, and the like. In other embodiments, molded stiffener 26 can also be disposed on surface 28 of lead frame 6 in the form of a strip, a plate, a ring, a rectangle, a square, an oval, and the like. In addition to the variety of shapes molded stiffener 26 can assume, the molded stiffener can come in various sizes (e.g., length 42, width 44, and thickness 46). Thus, the size and/or shape of molded stiffener 26 can be varied to correspond to the size and/or shape of lead frame 6 and die assembly 24.

Figure 7:
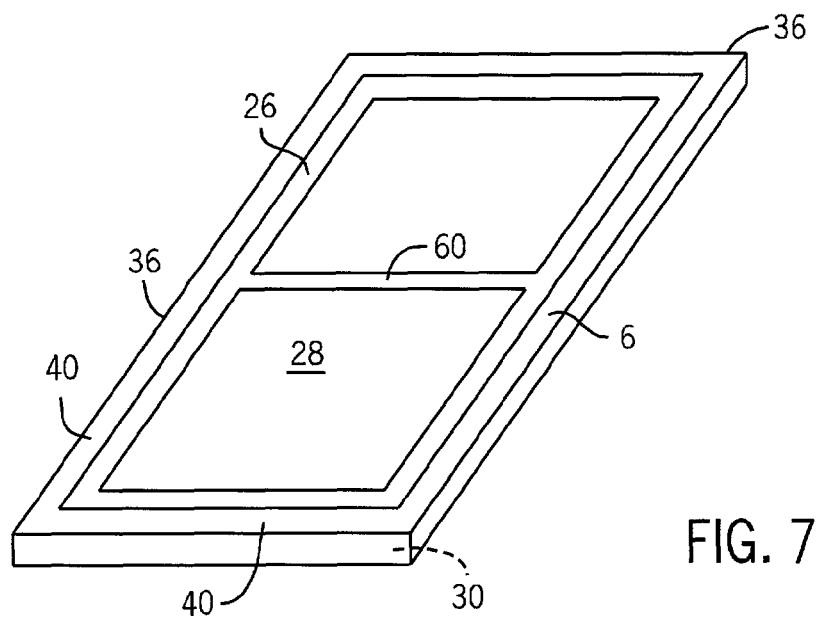
FIG. 7 is a perspective, top view of another embodiment of a molded stiffener according to the invention, incorporated and disposed within the lead frame.
Figure 8:
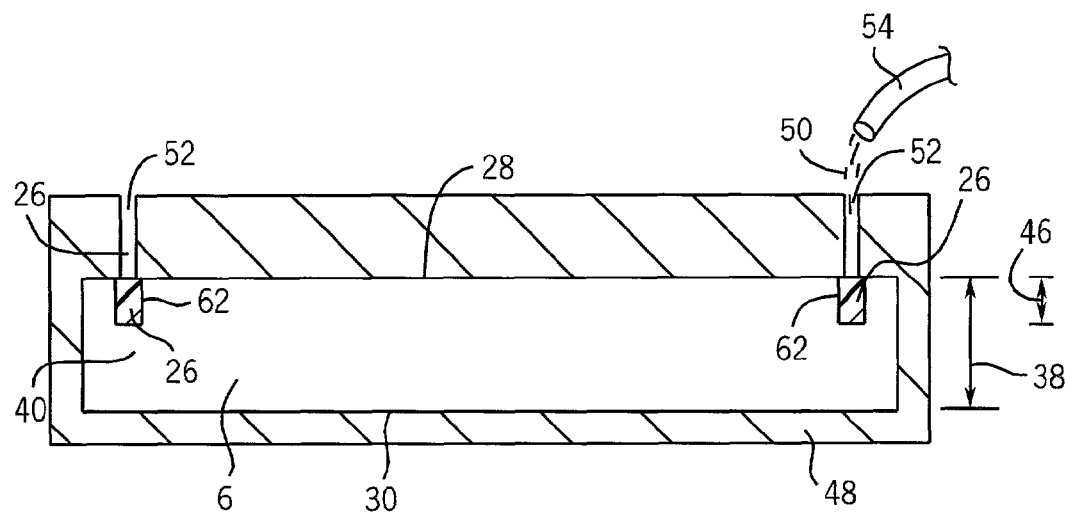
FIG. 8 is an elevational, end cross-sectional view illustrating an embodiment of a method according to the invention, wherein the molded stiffener of FIG. 7 is produced and secured to the lead frame using an injection molding technique.

As shown in FIG. 7, molded stiffener 26 can be integrally molded within the lead frame 6 structure such that the stiffener and the lead frame are flush-mounted together. In the embodiment of FIG. 7, stiffener material 26 can be injected or poured, as illustrated in FIG. 8, into an available recess 62 in lead frame 6 and then allowed to harden. Molded stiffener 26 can be molded within the structure of lead frame 6 during or after the manufacturing of the lead frame.

In each of the above embodiments, one benefit that molded stiffener 26 provides to lead frame 6 is rigidity and structural integrity, while still permitting flexibility. Further, in preferred embodiments, molded stiffener 26 and lead frame 6 have a coefficient of thermal expansion that is approximately equal. When the coefficient of thermal expansion for both molded stiffener 26 and lead frame 6 correspond, uneven expansion during the variety of heating, and cooling procedures involved in the fabrication of lead frames 6, die assemblies 24, packages 2, and other semiconductor or microelectronics, is avoided or reduced. Thus, stress at locations where molded stiffener 26 and lead frame 6 are molded together can be kept at a level sufficient to deter disengagement between the two components.

Figure 9:
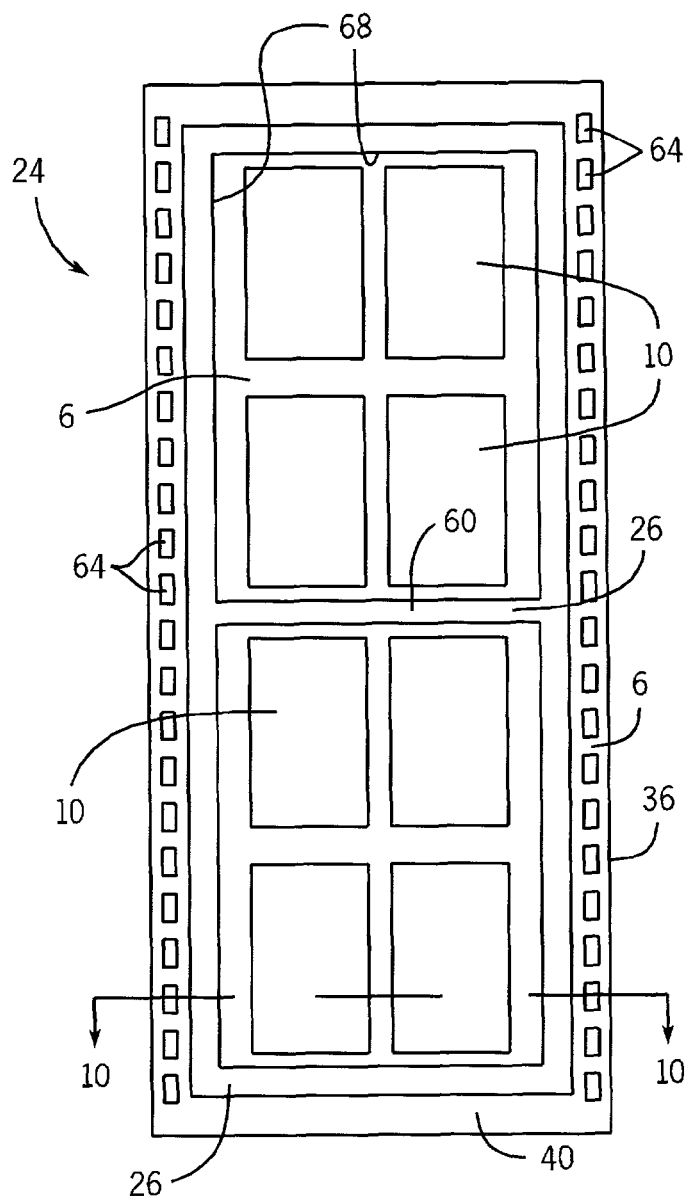
FIG. 9 is a top plan view of a lead frame assembly that comprises the molded stiffener of FIG. 3, as well as dies, secured to the lead frame and index holes disposed within the lead frame, the dies and index holes being shown relative to the molded stiffener.
Figure 10:
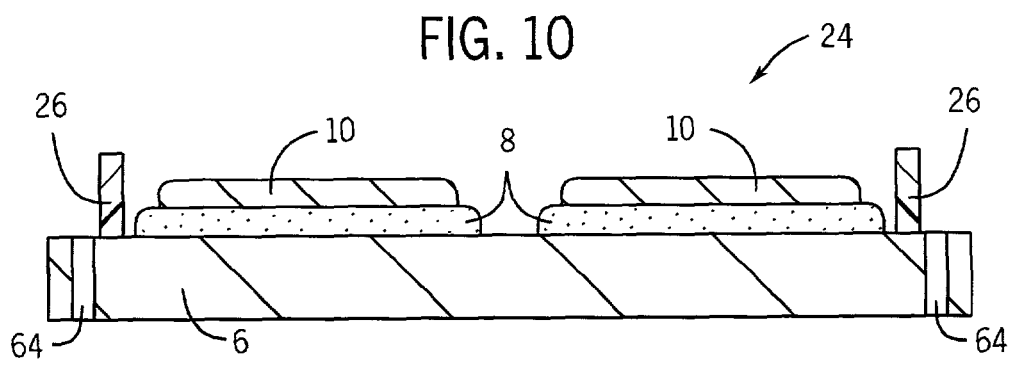
FIG. 10 is an elevational, end cross-section view of the lead frame assembly of FIG. 9 taken along line 10-10.

Turning to FIG. 9, an embodiment of a lead frame assembly 24 according to the invention is illustrated in detail. As previously stated, lead frame assembly 24 comprises lead frame 6 (or other substrate), the lead frame having one or more dies 10 disposed thereon. The methods of forming molded stiffener 26 on lead frame 6, as detailed above, are substantially the same as the methods of forming the molded stiffener on lead frame assembly 24, except that in the latter, the placement of dies 10 on the lead frame assembly is taken into account. In FIG. 10, a cross-section of lead frame assembly 24 of FIG. 9, taken along line 10-10, is illustrated to highlight molded stiffener 26 relative to the one or more dies 10 and lead frame 6. In preferred embodiments, lead frame assembly 24 further comprises a plurality of index holes 64 penetrating lead frame 6. Index holes 64, which can be penetrate lead frame 6 proximate periphery 40, permit conventional automated transfer mechanisms associated with chip bonders, wire bonders, molds, trim and form machinery, and other processing equipment to transport or handle lead frame 6, lead frame assembly 24, or package 66.

After desired components have been assembled to construct lead frame assembly 24, the lead frame assembly can be processed into semiconductor die packages 66, wherein lead frame assembly 24, or a portion thereof, is covered with encapsulating material 16. As previously stated, encapsulating material is typically used to protect die 10, lead frame 6, die assembly 24, integrated circuits, and other components from damage.

Figure 11:
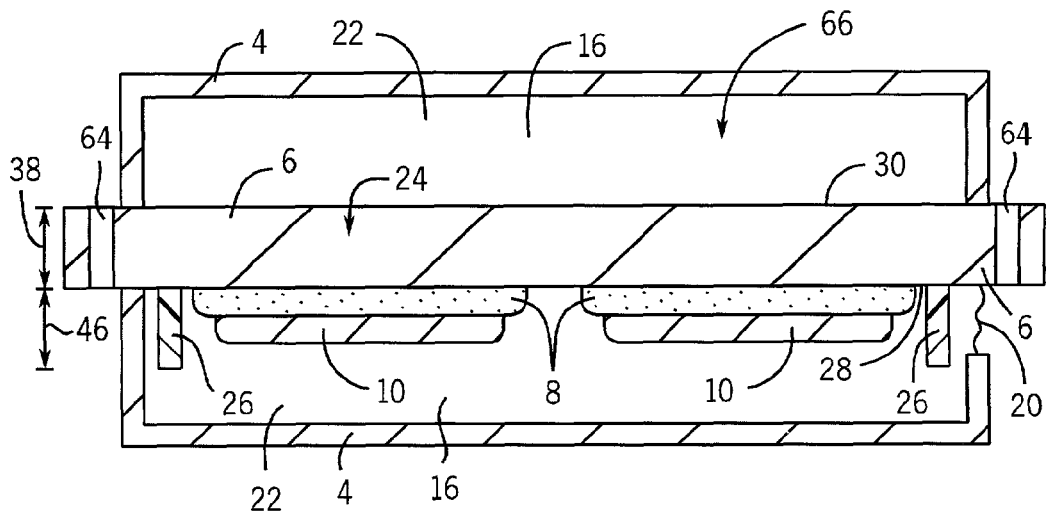
FIG. 11 is an elevational, end cross-section view of an embodiment of a package, according to the invention, incorporating the lead frame assembly of FIG. 9, the lead frame assembly being disposed within mold plates and encapsulated during a transfer molding process.

In one embodiment, as illustrated in FIG. 1, a conventional transfer molding process can be used to encapsulate lead frame assembly 24. In the transfer molding process, lead assembly 24 is placed within mold plates 18, as illustrated in FIG. 11. Thereafter, encapsulating material 16, which has typically been heated to provide a viscous, flowable liquid, is flowed under, over, and around lead frame 6, one or more dies 10, and/or molded stiffener 26. After encapsulating material 16 has hardened, mold plates 18 are removed to expose the resulting die packages 66.

Figure 12:
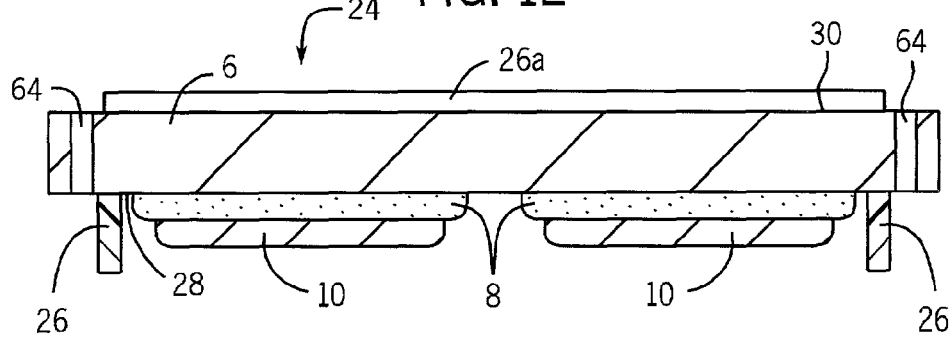
FIG. 12 is an elevational, end cross-section view of an embodiment of the lead frame assembly of FIG. 9 containing molded stiffeners of varying configurations disposed on opposing surfaces of the lead frame assembly.

In one embodiment, die package 66 can be fabricated from a lead frame assembly 24 that comprises two molded stiffeners 26, 26a on opposing surfaces (e.g., first surface 28 and second surface 30) of lead frame 6, as illustrated in FIG. 12. In one embodiment, the two molded stiffeners 26, 26a can comprise varying configurations and/or dimensions (e.g., length 42, width 44, and thickness 46). Two (or more) molded stiffeners 26, 26a can provide an extra measure of rigidity and support compared to the amount of rigidity and support provided by a lone stiffener. It is contemplated that a plurality of stiffeners can be disposed on lead frame 6 of lead frame assembly 24. Further, each of the plurality of stiffeners can comprise various configurations (e.g., size and/or shape).

Figure 13:
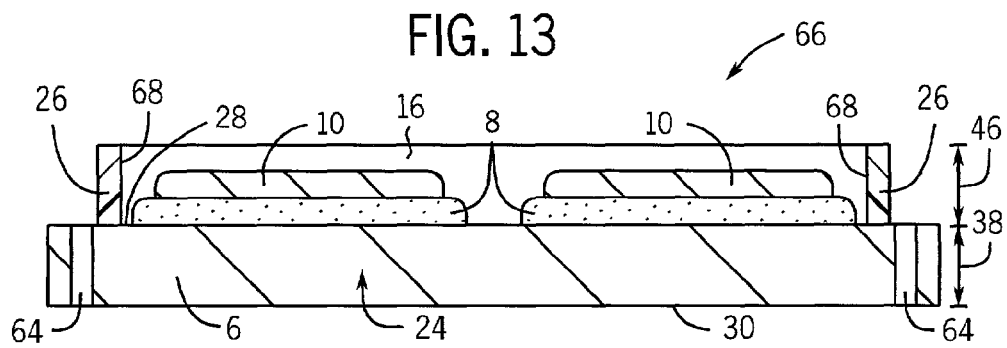
FIG. 13 is an elevational, end cross-section view of another embodiment of a package, according to the invention, incorporating the lead frame assembly of FIG. 9, the lead frame assembly employing a molded stiffener as a boundary for an encapsulating material applied to the lead frame assembly.

In another embodiment, as illustrated in FIG. 13, molded stiffener 26 can provide an enclosure or boundary 68 for encapsulating material 16, wherein package 66 can be made without using mold plates 18. In such cases, encapsulating material 16 is dispensed onto lead frame assembly 24 within boundary 68 of molded stiffener 26. Molded stiffener 26 functions to contain encapsulating material 16 within a confined area, resulting in package 66 as illustrated in FIG. 13.

In yet another embodiment, lead frame 6 can be configured to receive molded stiffener 26 thereon when the lead frame is in reel form (as opposed to being in strips). In these embodiments, a portion of the reel comprising lead frame 6 can be cut, truncated, singulated, separated, or otherwise partitioned into segments (not shown) before or after the molded stiffener has been molded onto the lead frame. In such embodiments, segments can be provided in order to ease or assist processing, provide one component (i.e., molded stiffener or lead frame) with dimensions that correspond to the dimensions of the other component. Segments can also be provided to separate components (e.g., die) disposed on die assembly 24 from each other. Unlike prior art stiffeners made of metal, molded stiffener 26 can be cut using conventional saw technology (e.g., diamond-tipped saw). Molded stiffener 26 can be cut separately, can be cut while disposed on lead frame 6, can be cut as a component of lead frame assembly 24, or can be cut as a component of package 66.

Despite the above methods being outlined in a step-by-step sequence, the completion of the acts or steps in a particular chronological order is not mandatory. Further, elimination, modification, rearrangement, combination, reordering, or the like, of the acts or steps is contemplated and considered within the scope of the description and claims.

While the present invention has been described in terms of the preferred embodiment, it is recognized that equivalents, alternatives, and modifications, aside from those expressly stated, are possible and within the scope of the appending claims.

In compliance with applicable statutes, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor device comprising:
   a substrate; and
   a plurality of molded plastic stiffener components attached to a first surface of the substrate without an adhesive element and comprising at least one cross member, the stiffener components effective to increase rigidity of the substrate, wherein the substrate and the stiffener components are separate components that are attached and secured together.

2. The device of claim 1, wherein the substrate is selected from a group consisting of a laminated polymer, a polyimide layer, a bismaleimide triazine (BT) resin, an FR4 laminate, an FR5 laminate, a CEM1 laminate, a CEM3 laminate, and a ceramic metal frame.

3. The device of claim 1, wherein the substrate has a thickness of less than about 75 microns.

4. The device of claim 1, wherein the substrate has a thickness of less than about 50 microns.

5. The device of claim 1, wherein the substrate has a thickness of less than about 35 microns.

6. The device of claim 1, wherein the stiffeners have a thickness of less than about 100 microns.

7. The device of claim 1, wherein the stiffener components have a thickness of less than about 75 microns.

8. The device of claim 1, wherein the stiffener components have a thickness of less than about 50 microns.

9. The device of claim 1, wherein the stiffener components comprise a thermoplastic material.

10. The device of claim 1, wherein the stiffener components comprise a thermosetting polymeric material.

11. The device of claim 1, wherein the thermal coefficient of expansion of the stiffener components and the substrate correspond such that heating expands both the stiffener components and the substrate approximately equally.

12. The device of claim 1, wherein the stiffener components are in a form selected from the group consisting of a grid, a lattice, a grille, and a web.

13. The device of claim 1, wherein one or more of the stiffener components are structured as an enclosure for containing an encapsulating material therein.

14. The device of claim 1, wherein the substrate comprises index holes.

15. The device of claim 1, wherein the substrate is in reel form.

16. A semiconductor device comprising:
   a substrate comprising a first surface, a second surface, and a periphery; and a plurality of molded plastic stiffener components attached to the first surface of the substrate proximate the periphery and comprising at least one cross member; the stiffener components attached to the substrate without an adhesive element, wherein the substrate and the stiffener components are separate components that are attached and secured together.

17. The device of claim 16, wherein the stiffener components protrude from the first surface of the substrate.

18. The device of claim 16, wherein the first surface of the substrate comprises a recess and the stiffener components are secured to the substrate within the recess.

19. The device of claim 18, wherein the stiffener components are about level with the first surface of the substrate.

20. A semiconductor assembly comprising:
a substrate having a first surface, a second surface, and a periphery;
a die situated on the first surface of the substrate; and
a plurality of molded plastic stiffener components attached to the first surface of the substrate without an adhesive element and comprising at least one cross member, wherein the substrate and the stiffener components are separate components that are attached and secured together.

21. The assembly of claim 20, wherein the stiffener components are situated at the periphery of the substrate.

22. The assembly of claim 21, further comprising a second molded plastic stiffener component secured to the second surface of the substrate without attachment with an adhesive element.

23. The assembly of claim 20, wherein the substrate is selected from a group consisting of a laminated polymer, a polyimide film, a bismaleimide triazine (BT) resin, an FR4 laminate, an FR5 laminate, a CEM1 laminate, a CEM3 laminate, and a ceramic metal frame.

24. A method of securing a stiffener to a substrate, comprising:
applying a stiffener material onto a first surface of a substrate to form a plurality of plastic stiffeners proximate a periphery of the substrate; and
hardening the stiffener material wherein the plurality of plastic stiffeners are attached to the substrate without an adhesive element, and the substrate and the plastic stiffeners are separate components that are attached and secured together, said hardening comprising at least one of heating the stiffener material, cooling the stiffener material, curing the stiffener material by means of a catalyst, and curing the stiffener material by exposure to radiation.

25. The method of claim 24, wherein applying the stiffener material comprises a molding process selected from the group consisting of transfer molding, injection molding, and spray molding.

26. The method of claim 24, wherein applying the stiffener material comprises applying an encapsulating material to the substrate and molding the encapsulating material into said stiffeners.

27. A method of securing a stiffener to a lead frame assembly, comprising a substrate having a first surface, a second surface, and a periphery, and two or more dies situated on the first surface of the substrate; the method comprising:
molding a stiffener material onto a first surface of the substrate of the lead frame assembly to form a plurality of molded stiffeners attached to the first surface of the substrate without an adhesive element, wherein the substrate and the stiffener components are separate components that are attached and secured together;
encapsulating at least a portion of the two or more dies situated on the lead frame assembly; and
singulating the lead frame assembly having the molded stiffeners situated thereon, to separate the two or more dies.

28. The method of claim 27, wherein:
the stiffener material is molded onto the substrate to provide a boundary at least partially around the dies on the substrate,
encapsulating said die comprises dispensing an encapsulating material onto the dies, and
the molded stiffeners are structured to contain the encapsulating material within said boundary.

29. A method of forming a semiconductor die package, comprising:
securing a die to a first surface of a substrate;
molding a stiffener material onto said surface of the substrate to form a plurality of molded plastic stiffeners thereon such that the stiffeners are attached to the substrate without an adhesive element and comprises at least one cross member, wherein the substrate and the plastic stiffeners are separate components that are attached and secured together; and
encapsulating the die and the molded plastic stiffeners with an encapsulating material to form the semiconductor die package.

30. The method of claim 29, wherein encapsulating the die and the plastic stiffeners comprises positioning the substrate with the die and the molded plastic stiffeners situated thereon between two mold plates, and removing the package from the mold plates after the encapsulating material has hardened.

31. A method of forming a semiconductor die package, comprising:
mounting a die on a first surface of a lead frame;
molding a plurality of plastic stiffeners comprising at least one cross member onto the first surface of the lead frame such that the stiffeners are attached to the substrate without an adhesive element, wherein the substrate and the stiffeners are separate components that are attached and secured together;
applying an encapsulating material to the die and the stiffeners; and
hardening the encapsulating material to produce the semiconductor die package.

32. A semiconductor device, comprising:
a substrate comprising first and second surfaces, and a periphery; and
a plurality of molded thermoplastic components attached to the first surface of the substrate proximate the periphery without an adhesive element, the plurality of molded thermoplastic components structured to stiffen the substrate and comprising at least one cross member, wherein the substrate and the stiffeners are separate components that are attached and secured together.

33. A semiconductor device, comprising:
a substrate comprising first and second surfaces, and a periphery;
a plurality of molded thermoplastic components attached to the first surface of the substrate proximate the periphery without an adhesive element, the plurality of molded thermoplastic components structured to stiffen the substrate and comprising at least one cross member, wherein the substrate and the stiffeners are separate components that are attached and secured together, and
a die mounted on the first surface of the substrate.

34. A semiconductor device, comprising:
a substrate comprising first and second surfaces, and a periphery;
a plurality of molded thermoset plastic components attached to the first surface of the substrate proximate the periphery without an adhesive element, the plurality of molded thermoset plastic components structured to stiffen the substrate and comprising at least one cross member, wherein the substrate and the stiffeners are separate components that are attached and secured together, and
a die mounted on the first surface of the substrate.

35. A semiconductor device, comprising:
a substrate comprising first and second surfaces, and a periphery;
a plurality of molded thermoplastic components attached to the first surface of the substrate without an adhesive element, the plurality of molded thermoset plastic components situated proximate the periphery and structured to stiffen the substrate and comprising at least one cross member, wherein the substrate and the stiffeners are separate components that are attached and secured together, and
an element situated along the periphery of the substrate and structured for engagement with a processing mechanism for transporting the substrate.

36. The device of claim 35, wherein the engagement element comprises a plurality of index holes proximate the periphery of the substrate.

37. The device of claim 35, wherein the substrate comprises a lead frame.

38. A semiconductor device, comprising:
a lead frame comprising first and second surfaces, and a periphery;
a plurality of molded thermoplastic components attached to the first surface of the lead frame along the periphery to stiffen the lead frame and comprising at least one cross member, wherein the lead frame and the stiffeners are separate components that are attached and secured together, and
a plurality of index holes proximate the periphery of the lead frame and structured for handling the lead frame by a processing mechanism.

39. A method of forming a semiconductor device, comprising:
molding a plastic material onto a first surface of a substrate proximate a periphery of the substrate to form a plurality of molded plastic stiffeners attached to the first surface of the substrate without an adhesive element and comprising at least one cross member, wherein the substrate and the stiffeners are separate components that are attached and secured together.

40. A method of forming a semiconductor device, comprising:
applying a plastic material onto a first surface of a substrate proximate a periphery of the substrate by a molding process to form a plurality of stiffeners comprising at least one cross member; and
hardening the plastic material on the substrate to form the stiffeners attached to the first surface of the substrate without an adhesive element, wherein the substrate and the stiffeners are separate components that are attached and secured together.

41. The method of claim 40, wherein applying the stiffening material comprises a transfer molding process.

42. The method of claim 40, wherein applying the plastic material comprises an injection molding process.

43. The method of claim 40, wherein applying the plastic material comprises a spray molding process.

44. The method of claim 40, wherein the plastic material comprises a thermoplastic material.

45. The method of claim 40, wherein the plastic material comprises a thermosetting polymeric material.

46. The method of claim 40, wherein hardening the plastic material comprises heating the plastic material.

47. The method of claim 40, wherein hardening the plastic material comprises cooling the plastic material.

48. The method of claim 40, wherein the plastic material comprises a catalyst, and hardening the plastic material comprises curing the plastic material.

49. The method of claim 40, wherein hardening the plastic material comprises curing the plastic material by exposure to radiation.

50. A method of forming a semiconductor device, comprising:
applying a flowable plastic material onto a first surface of a substrate proximate a periphery of the substrate to form a plurality of stiffeners thereon;
hardening the plastic material on the substrate to form said plurality of stiffeners attached to the first surface of the substrate without an adhesive element, wherein the substrate and the stiffeners are separate components that are attached and secured together;
mounting a die on the first surface of the substrate; and
encapsulating at least a portion of the die.

51. A method of forming a semiconductor device, comprising:
molding a plastic material onto a first surface of a substrate proximate a periphery of the substrate to form a plurality of stiffeners;
hardening the plastic material on the substrate to form said plurality of stiffeners attached to the substrate without an adhesive element, wherein the substrate and the stiffeners are separate components that are attached and secured together;
mounting a die on the first surface of the substrate; and
encapsulating at least a portion of the die.

52. The method of claim 51, wherein molding the plastic material comprises a process selected from the group consisting of transfer molding, injection molding, and spray molding.

53. A semiconductor device comprising: a plurality of molded plastic stiffeners attached to a first surface of a substrate without an adhesive element and comprising at least one cross member, wherein the substrate and the stiffeners are separate components that are attached and secured together.

54. A semiconductor device comprising: a plurality of molded plastic stiffeners in the form of a plate attached to a first surface of a substrate without an adhesive element, said plurality of stiffeners comprising at least one cross member; wherein the substrate and the stiffeners are separate components that are attached and secured together.

55. A semiconductor device comprising: a plurality of molded plastic stiffeners in the form of strips attached to a first surface of a substrate without an adhesive element; said plurality of stiffeners comprising at least one cross member, wherein the substrate and the stiffeners are separate components that are attached and secured together.

56. A semiconductor device comprising: a substrate with a plurality of strips of a molded plastic stiffener attached to a first surface of said substrate without an adhesive element, the strips of said stiffener comprising at least one cross member; wherein the substrate and the strips of said stiffeners are separate components that are attached and secured together.

57. A semiconductor device comprising:
a plurality of stiffeners comprising a molded plastic stiffener component comprising at least one cross member attached to a first surface of a substrate without an adhesive element, the stiffener component effective to increase rigidity of the substrate, wherein the substrate and the stiffener component are separate components that are attached and secured together.

58. The device of claim 57, wherein the substrate comprises a periphery, and the stiffener component is attached proximate the periphery of the substrate.

59. The device of claim 57, further comprising a second molded plastic stiffener component secured to a second surface of the substrate without attachment with an adhesive element.

* * * * *